US 8,618,502 B2

(12) United States Patent
Syms et al.

(10) Patent No.: US 8,618,502 B2
(45) Date of Patent: Dec. 31, 2013

(54) MOUNTING ARRANGEMENT (75) Inventors: Richard Syms, London (GB); Andrew Holmes, Reading (GB); Shane Martin O'Prey, London (GB)

(73) Assignee: Microsaic Systems PLC, Woking, Surrey (GB)

( * ) Notice: Subject to any disclaimer, the term of this patent is extended or adjusted under 35 U.S.C. 154(b) by 882 days.

(21) Appl. No.: 12/290,777

(22) Filed: Nov. 3, 2008

(65) Prior Publication Data
US 2009/0127481 A1   May 21, 2009

(30) Foreign Application Priority Data

Nov. 2, 2007 (GB) .................................. 0721531.2

(51) Int. Cl.
G21K 5/10 (2006.01)

(52) U.S. Cl.
USPC .... 250/440.11; 250/306; 250/307; 250/443.1

(58) Field of Classification Search
None
See application file for complete search history.

(56) References Cited

U.S. PATENT DOCUMENTS

| | | | | |
|---|---|---|---|---|
| 4,005,321 A | * | 1/1977 | Shibata et al. | 310/348 |
| 6,025,591 A | * | 2/2000 | Taylor et al. | 250/292 |
| 6,177,668 B1 | | 1/2001 | Hager | |
| 6,465,792 B1 | | 10/2002 | Baptist | |
| 6,972,406 B2 | * | 12/2005 | Syms | 250/281 |
| 7,208,729 B2 | * | 4/2007 | Syms | 250/288 |
| 7,294,954 B2 | * | 11/2007 | Syms | 313/103 CM |
| 7,615,744 B1 | * | 11/2009 | Syms | 250/288 |
| 7,786,434 B2 | * | 8/2010 | Syms et al. | 250/288 |
| 2003/0103205 A1 | * | 6/2003 | Gianchandani et al. | 356/311 |
| 2004/0238755 A1 | * | 12/2004 | Lee et al. | 250/423 R |
| 2005/0077897 A1 | * | 4/2005 | Syms | 324/318 |
| 2005/0151054 A1 | * | 7/2005 | Syms | 250/207 |
| 2006/0071161 A1 | * | 4/2006 | Syms | 250/290 |
| 2007/0014920 A1 | * | 1/2007 | Syms | 427/256 |
| 2008/0001082 A1 | * | 1/2008 | Syms et al. | 250/288 |
| 2008/0185518 A1 | * | 8/2008 | Syms | 250/296 |
| 2009/0261244 A1 | * | 10/2009 | Syms | 250/288 |

FOREIGN PATENT DOCUMENTS

| | | | | |
|---|---|---|---|---|
| GB | 2391694 | | 2/2004 | |
| GB | 2391694 A | * | 2/2004 | ............. H01J 49/42 |
| GB | 2451239 A | * | 1/2009 | ............. H01J 3/14 |
| JP | 10107405 A | * | 4/1998 | ............. H05K 3/32 |
| WO | WO 9631901 A1 | * | 10/1996 | ............. H01J 49/42 |

OTHER PUBLICATIONS

Paul, W., et al., "Das elektrische Massenfilter," *Zietschrift für Physik*, Bd. 140, S. 262-273 (1955).

(Continued)

*Primary Examiner* — Andrew Smyth
(74) *Attorney, Agent, or Firm* — Bishop Diehl & Lee, Ltd.

(57) ABSTRACT

This invention provides a method of mounting cylindrical electrodes in the geometry of a miniature electrostatic quadrupole, which can act as a quadrupole mass filter or a quadrupole ion guide, or be used in a linear quadrupole ion trap. The electrodes are mounted in pairs on microfabricated supports, which are formed from conducting parts on an insulating substrate. The supports include a suspended flexure system to relieve strains caused by mismatch between the thermal expansion coefficients of the electrodes and the substrate. A complete quadrupole is constructed from two such supports, which are spaced apart by further conducting spacers.

27 Claims, 7 Drawing Sheets

(56) References Cited

OTHER PUBLICATIONS

Denison, D.R., "Operating Parameters of a Quadrupole in a Grounded Cylindrical Housing," *The Journal of Vacuum Science and Technology*, vol. 8, No. 1, pp. 266-269.

Dawson, P.H., "Performance Characteristics of an R.F.-Only Quadrupole," *International Journal of Mass Spectrometry and Ion Processes*, 67 (1985) pp. 267-276.

Miller, Philip E., et al., "The Transmission Properties of an RF-Only Quadrupole Mass Filter," *International Journal of Mass Spectrometry and Ion Processes*, 72 (1986) 223-238.

Douglas, D.J., "Applications of Collision Dynamics in Quadrupole Mass Spectrometry," *J. Am. Soc. Mass Spectrom*, 1998, 9, pp. 101-113.

Prestage, J.D., et al., "New ion trap for frequency standard applications," *Journal of Applied Physics*, 66 (3), Aug. 1, 1989, pp. 1013-1017.

Hager, James W., "A new linear ion trap mass spectrometer," *Rapid Communications in Mass Spectrometry*, 2002; 16: 512-526.

Campbell, J.M., "A New Linear Ion Trap Time-of-flight System with Tandem Mass Spectrometry Capabilities," *Rapid Communications in Mass Spectrometry*, 12, 1463-1474 (1998).

Dawson, P.H., et al., "Some Distortions in Quadrupole Fields and Their Relations to Mass Filter Performance," *International Journal of Mass Spectrometry and Ion Physics*, 29 (1979) 269-299.

Dawson, P.H., "Quadrupole Mass Filters with Bent or Bowed Rod Sets," *International Journal of Mass Spectrometry and Ion Physics*, 84 (1988) 185-201.

Syms, R.R.A., et al., "Fabrication of a microengineered quadrupole electrostatic lens," *Electronics Letters*, Oct. 24, 1996, vol. 32, No. 22, pp. 2094-2095.

Syms, R.R.A., et al., "Design of a Microengineered Electrostatic Quadrupole Lens," *IEEE Transactions on Electron Devices*, vol. 45, No. 11, Nov. 1998, pp. 2304-2311.

Taylor, S., et al., "Performance improvements for a miniature quadrupole with a micromachined mass filter," *Vacuum*, 53 (1999) 203-206.

Geear, Martin, et al., "Monolithic MEMS Quadrupole Mass Spectrometers by Deep Silicon Etching," *Journal of Microelectromechanical Systems*, vol. 14, No. 5, Oct. 2005, pp. 1156-1166.

Tang, William C., et al., "Laterally Driven Polysilicon Resonant Microstructures," downloaded Nov. 7, 2008 from IEEE Xplore.

Hynes, A.M., et al., "Recent advances in silicon etching for MEMS using the ASE™ process," *Sensors and Actuators*, 74 (1999) 13-17.

Mita, Yoshio, et al., "A Silicon Shadow Mask With Unlimited Patterns and a Mechanical Alignment Structure by Al-Delay Masking Process," *Trans. IEEJ*, Jul. 2000, extended summary.

Young, W.C., et al., *Roark's formulas for stress and strain*, 7th Edn., McGraw Hill International, New York (1989).

\* cited by examiner

MOUNTING ARRANGEMENT

CROSS-REFERENCE TO RELATED APPLICATIONS

This application claims priority to United Kingdom Application GB0721531.2, filed Nov. 2, 2007, which is hereby incorporated by reference.

FEDERALLY SPONSORED RESEARCH OR DEVELOPMENT

Not Applicable.

TECHNICAL FIELD

This invention relates to mounting arrangements for one or more electrodes onto a support member. More particularly the invention relates to such mounting arrangements that compensate for thermal coefficient differences between both the electrode and the support member. The invention has particular application in mass spectrometry, and more particular to the provision of a miniature quadrupole mass filter, a linear quadrupole ion trap or a quadrupole ion-guide with a high tolerance of temperature variations.

BACKGROUND OF THE INVENTION

Miniature mass spectrometers have application as portable devices for the detection of biological and chemical warfare agents, drugs, explosives and pollutants, as instruments for space exploration, and as residual gas analysers. Further applications exist for low cost systems in pharmaceutical analysis. Mass spectrometers consist of three main subsystems: an ion source, an ion filter, and an ion counter.

One of the most successful variants is the quadrupole mass spectrometer, which uses an electrostatic quadrupole as a mass-filter [Paul 1953]. Conventional quadrupoles consist of four cylindrical electrodes, which are mounted parallel and with their centre-to-centre spacing at a well-defined ratio to their diameter [Dawson 1976; Denison 1971]. Ions are injected into the pupil between the electrodes, and travel parallel to the electrodes under the influence of a time-varying field approximating an ideal hyperbolic potential variation. This field contains both a direct current (DC) and an alternating current (AC) component. The frequency of the AC component is fixed, and the ratio of the DC voltage to the AC voltage is also fixed. Studies of the dynamics of an ion in such a field have shown that only those ions with a particular charge to mass ratio will transit the quadrupole without discharging against one of the rods. Consequently, the device acts as a mass filter. The ions that successfully exit the filter may be detected. If the DC and AC voltages are ramped together, the detected signal is a spectrum of the different masses that are present in the ion flux. The largest mass that can be detected is determined from the largest voltage that can be applied.

If the DC component is omitted, and the quadrupole is operated in RF-only mode, the action of the field is different, and the quadrupole acts as an all-pass filter or ion guide [Dawson 1985; Miller 1986]. When ion transmission is interrupted by collisions with other ions or neutrals, a form of ion focusing known as collision focusing takes place. As a result quadrupole ion guides have a variety of applications in mass spectrometers, including devices for enhancement of transmission and devices for ion fragmentation known as collision cells [Douglas 1998].

An electrostatic quadrupole may also be used in an alternative form of mass spectrometer known as a linear quadrupole ion trap [Prestage 1989]. If suitable barrier potentials are provided using additional electrodes at the ends of the quadrupole, ions may be confined inside the quadrupole and perform multiple transits up and down its axis. Ions may be mass selectively ejected from the exit by a variety of means including using an auxiliary AC voltage applied to the end electrode, at the same time as ions are admitted at the entrance [Hager 1989; U.S. Pat. No. 6,177,668]. Improved filter performance follows from the increased number of RF cycles experienced by the ions and increased signal-to-noise ratio follows from the accumulation of ions inside the trap. A linear ion trap may also be operated using time gating of the end potentials [Campbell 1998].

The resolution quadrupole filter is determined by two main factors: the number of cycles of alternating voltage experienced by each ion, and the accuracy with which the desired field is created. So that each ion experiences a large enough number of cycles, the ions are injected with a small axial velocity, and a radio frequency AC component is used.

The accuracy with which the field is created is determined by the shape and size of the electrodes, and by their placement and their straightness. Numerous studies have shown that a good approximation to a hyperbolic field is provided by cylindrical electrodes with their centre-to-centre spacing at a well-defined ratio to their diameter. However, a reduction in the mass resolution is caused by misplacement of the electrodes [Dawson 1979], by bending of the electrodes [Dawson 1988] or by other distortions of the field.

To avoid such problems, highly accurate methods of construction are employed. However, it becomes increasingly difficult to obtain the required precision as the size of the structure is reduced. Microfabrication methods are therefore increasingly being used to miniaturise mass spectrometers, both to reduce costs and allow portability. These processes are generally carried out on planar substrates, which are often silicon or multilayers containing silicon. The most important of the processes considered here include:

Patterning methods such as photolithography;
Etching methods such as deep reactive ion etching of silicon;
Bonding methods such as anodic bonding of silicon and direct bonding of silicon;
Isolation methods such as oxidation of silicon;
Coating methods such as sputtering of metals;
Interconnection methods such as thermocompression bonding of gold wire.

These methods are well known to those skilled in the art, and can be employed in many different combinations to achieve a given microstructured object.

For example, a miniature silicon-based quadrupole electrostatic mass filter consisting of four cylindrical electrodes mounted in pairs on two oxidised silicon substrates was demonstrated some years ago. The substrates were held apart by two cylindrical insulating spacers, and V-shaped grooves formed by anisotropic wet chemical etching were used to locate the electrodes and the spacers. The electrodes were metal-coated glass rods soldered to metal films deposited in the grooves [U.S. Pat. No. 6,025,591].

Mass filtering was demonstrated using devices with electrodes of 0.5 mm diameter and 30 mm length [Syms et al. 1996; Syms et al. 1998; Taylor et al. 1999]. Performance was limited by RF heating, caused by electrical coupling between co-planar cylindrical electrodes through the oxide interlayer via the substrate. As a result, the device presented a poor electrical load, the solder attaching the cylindrical electrodes tended to melt, and differences in expansion coefficient between the cylindrical electrodes and the substrate caused the electrodes to detach. These effects restricted the voltage and frequency that could be used, which in turn limited the mass range (to around 100 atomic mass units) and the resolution.

In an effort to overcome these limitations, an alternative miniature construction based on bonded silicon-on-insulator (BSOI) was developed [GB 2391694]. BSOI consists of an oxidised silicon wafer, to which a second silicon wafer has been bonded. The second wafer may be polished back to the desired thickness, to leave a silicon-oxide-silicon multi-layer. In this geometry, cylindrical stainless steel electrodes were mounted in pairs on two substrates. The oxide interlayer was largely removed, so that electrical coupling between co-planar cylindrical electrodes via the substrate was greatly reduced. As a result, the device could withstand considerably higher voltages, and a mass range of 400 atomic mass units was demonstrated [Geear 2005].

The cylindrical electrodes were retained by the pressure contact of two silicon springs etched into the substrate of the BSOI wafer. The spring retaining system allowed a sliding motion of the electrodes, so that variations in temperature did not cause strains due to differences in the thermal expansion coefficients of the stainless steel cylindrical electrodes and the silicon mount. However, the sliding motion allowed the position of the electrodes to alter slightly, either over long periods of time or following mechanical shocks, degrading the constructional accuracy of the filter.

There is therefore a benefit in rigidly retaining the electrodes on the supporting substrates but there are still problems regarding differences in thermal expansion coefficients between the electrodes and their respective mounts.

SUMMARY OF THE INVENTION

Accordingly there is a need for a mounting arrangement for an electrode onto a support member that compensates for thermal coefficient differences between both the electrode and the support member. Such a mounting arrangement is particularly useful in provision of a mounting for a miniature quadrupole mass filter, linear quadrupole ion trap or quadrupole ion guide, in which good electrical performance is combined with mechanical insensitivity to temperature variations.

Accordingly the invention provides a mounting arrangement according to claim 1. Advantageous embodiments are provided in the claims dependent thereto. The invention also provides a mount according to claims 13 or 19 with advantageous embodiments provided in the claims dependent thereto.

These and other features will be better understood with reference to the following drawings.

DETAILED DESCRIPTION

A mounting arrangement for at least one electrode will now be described with reference to an exemplary application thereof, that of achieving alignment of sets of cylindrical metal electrodes in a geometry of a miniature electrostatic quadrupole. Use of such a mounting arrangement is particularly advantageous within the context of the teaching of our earlier application GB0701809.6, which shows methods of aligning sets of cylindrical metal electrodes in the geometry of a miniature electrostatic quadrupole, which can act as a quadrupole mass filter, a linear quadrupole ion trap or a quadrupole ion guide. In that arrangement, the electrodes are mounted in two pairs on two microfabricated supports, which are formed from conducting parts on an insulating substrate. Using the teaching of the present invention it is possible to provide the supports, which were previously described in GB0701809.6 as rigid supports, in the form of a suspended flexure system to relieve thermal strains caused by mismatch between the expansion coefficients of the cylindrical electrodes and their mountings. A complete quadrupole may be constructed from two such insulating substrates, which are held apart by further conducting spacers. The construction of the mount can be better understood with reference to FIGS. 1-7, which is provided as an illustrative example of how a mounting arrangement provided in accordance with the teaching of the invention may be usefully employed. It will therefore be appreciated that while this exemplary arrangement is in the provision of a quadrupole that a mounting invention provided in accordance with the teaching of the invention is not to be considered as being limited to such applications.

Figure 1:
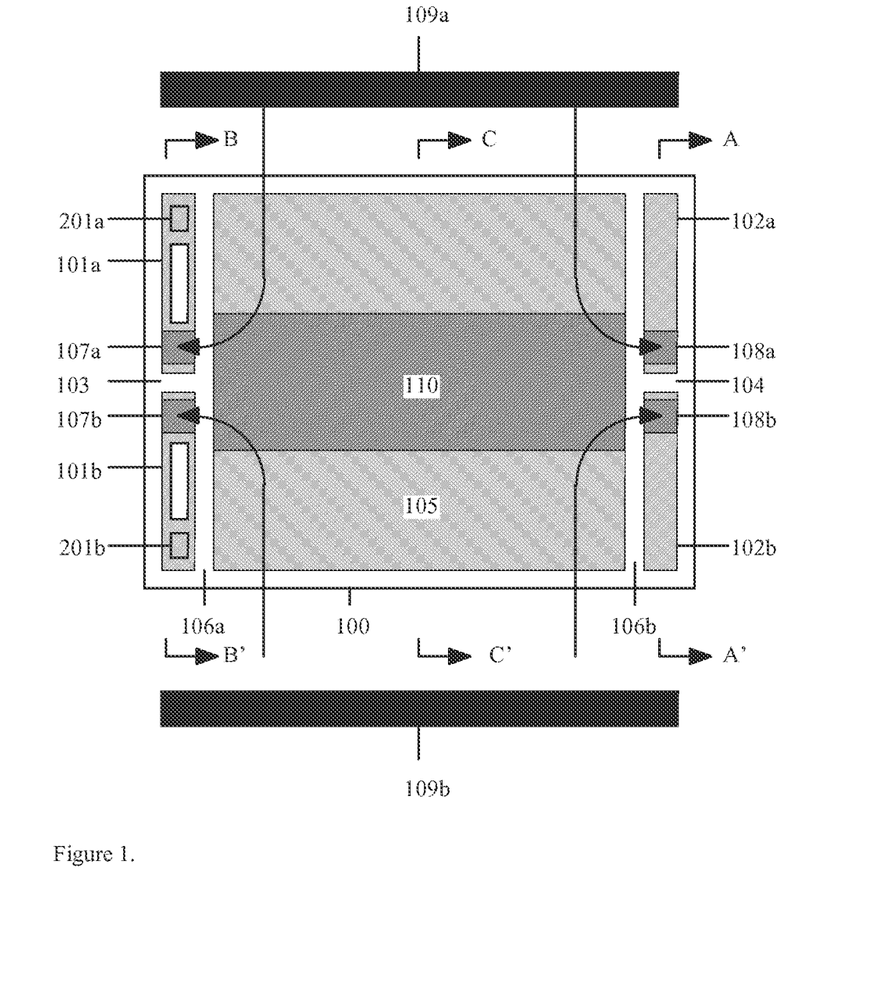
FIG. 1 shows the layout in plan of a strain relieved mounting for two of the cylindrical electrodes in a miniature electrostatic quadrupole, according to the present invention.

FIG. 1 shows the layout, in plan, of one of the two cylindrical electrode mounts, which consists of a set of parts or support members formed on an insulating substrate 100, which may be provided in accordance with the teaching of the invention. The parts are desirably conducting or coated with a conducting layer. In this exemplary arrangement, a pair of flexible supports 101a, 101b are provided at one end of the substrate, and a pair of rigid supports 102a, 102b are provided at the other end. The two flexible supports 101a and 101b and the two rigid supports 102a, 102b are separated by central gaps 103 and 104, i.e. they are physically distinct from one another. The four supports 101a, 101b and 102a, 102b are further separated from a central feature 105 by gaps 106a, 106b.

Each of the flexible support 101a and the rigid support 102a provide locating features 107a and 108a for the two ends of a first cylindrical electrode 109a, in this exemplary arrangement the opposing two ends. Similarly, the flexible support 101b and the rigid support 102b provide locating features 107b and 108b for the two ends of a second cylindrical electrode 109b. The central feature 105 contains a trench 110 along its length, and the gaps 103, 104, 106a, 106b provide electrical isolation between the parts.

Figure 2:
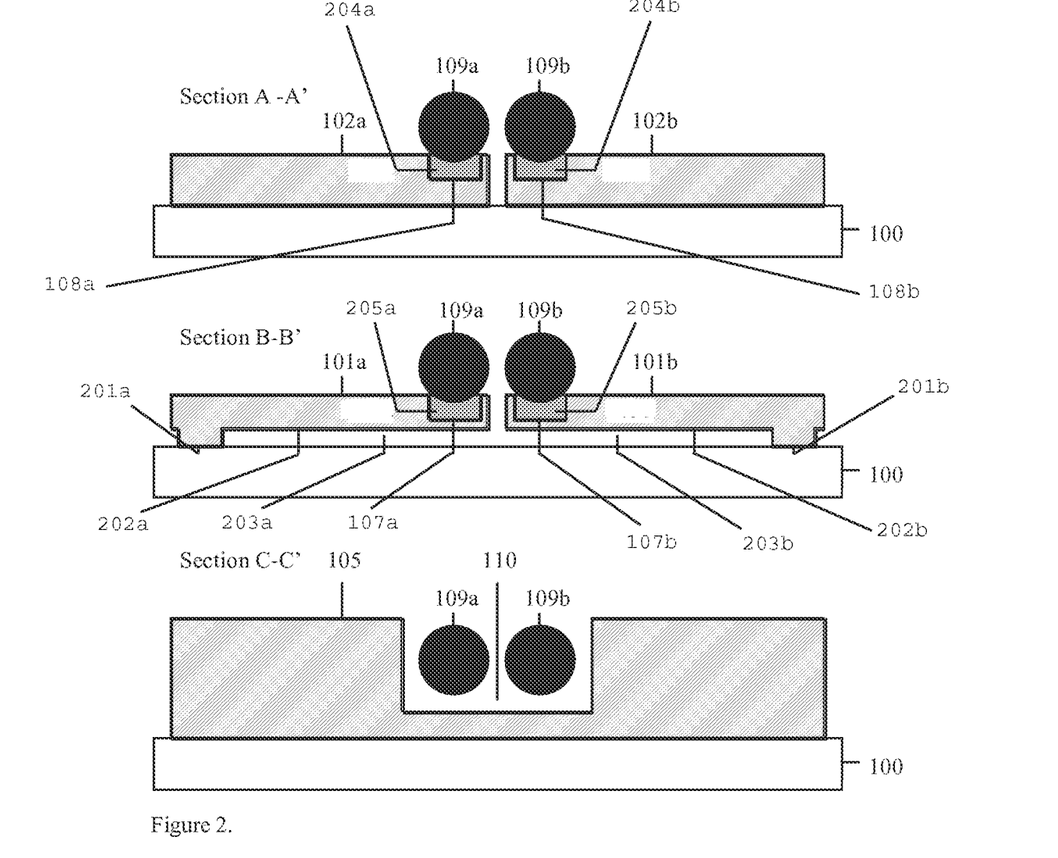
FIG. 2 shows the layout in sections of a strain relieved mounting for two of the cylindrical electrodes in a miniature electrostatic quadrupole, according to the present invention.

FIG. 2 shows the layout in sections of the part shown in FIG. 1. The two rigid electrode supports 102a, 102b in section A-A' consist of two blocks of material that are fixed to the substrate 100 along their entire length. The rigid electrode supports 102a, 102b support one end of the two cylindrical electrodes 109a, 109b in locating features 108a, 108b. The two flexible supports 101a, 101b in section B-B' consist of two blocks of material that are fixed to the substrate 100 only along part of their length at lands 201a, 201b. In other regions 202a, 202b the flexible supports are suspended above the substrate 100 by clearances 203a, 203b. The suspension of the flexible supports allows relative movement along at least a portion of the length of the flexible support to the substrate. It will be understood that the flexible supports have a fixed end which is physically fixed to the substrate 100 and a second end, distally located from that fixed end, which is capable of moving relative to the substrate. The flexible electrode supports 101a, 101b support the other end of the two cylindrical electrodes 109a, 109b in locating features 107a, 107b, which are typically (as shown in FIG. 2) located at this second end of the flexible supports. The cylindrical electrodes 109a, 109b in section C-C' lie parallel to one another within the trench 110 in the feature 105. The walls of the trench 110 do not contact the cylindrical electrodes, but provide a partial surrounding shield.

The cylindrical electrodes may be attached to their supports in the regions 204a, 204b, 205a, 205b by a variety of methods including the use of conducting epoxy and solder. Although the cylindrical electrodes are therefore rigidly fixed to their supports, the suspended parts 202a, 202b are free to move parallel to the substrate plane if formed in a suitable material and arrangement. Consequently it will be appreciated that motion of the two suspended parts 202a, 202b in the plane of the substrate and parallel to the axis of the cylindrical electrodes can relieve an axial strain due to a mismatch in thermal expansion coefficient between the cylindrical electrodes and their mounting. It will also be appreciated that by fixing the same ends of the pair of cylindrical electrodes to the substrate, axial alignment between the electrodes is preserved in the process.

An example of a suitable elastic support for each cylindrical electrode may be provided by a portal frame suspension. A portal frame is a simple arrangement of elastic elements that combines controllable linear stiffness in one direction (the in-plane direction) with high stiffness in the perpendicular direction (the out-of-plane direction). Portal frames are commonly used in microfabricated devices to provide approximately linear motion such as that described in Tang 1989. However it will be understood that it is not intended to limit the present invention to this exemplary arrangement as other forms of suspended elastic element may suffice to provide thermal coefficient compensation.

Figure 3:
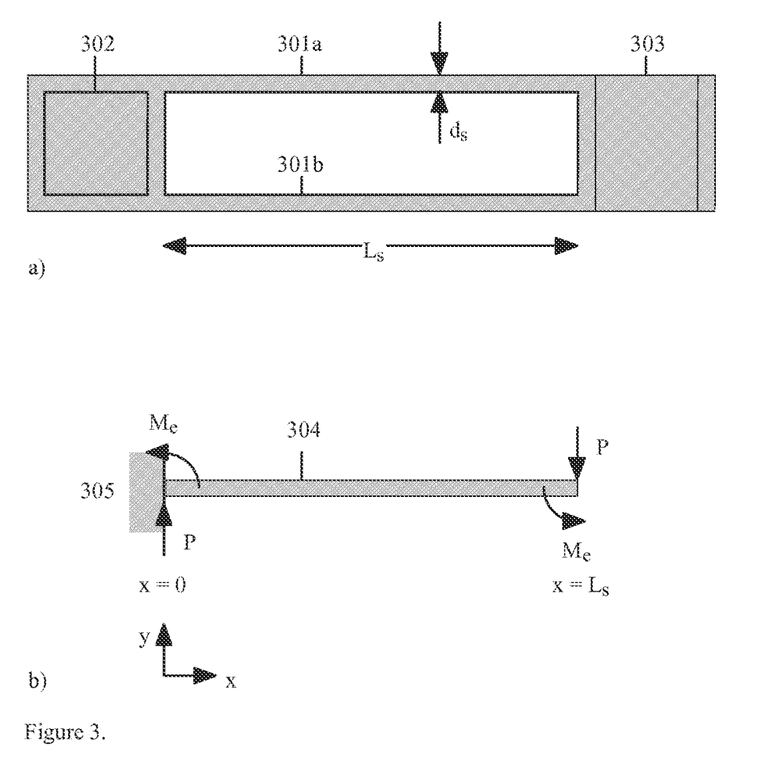
FIG. 3 shows in schematic a) the layout of a suspended portal frame elastic suspension, and b) the effective end loading system on one of the two beams that comprise the suspension.

FIG. 3a shows the layout of a portal frame, which consists of two parallel beams 301a, 301b of length $L_s$, depth $d_s$ in the plane of the figure and breadth $b_s$ perpendicular to the figure. The depth $d_s$ is assumed to be much less than the breadth $b_s$, so that the stiffness is much lower against in-plane displacements than against out-of plane displacements. The beams are rigidly attached to a support 302 at one end (the built-in end) and linked by a rigid element 303 at the other (the free end). The support 302 corresponds to the lands 201a, 201b in FIGS. 1 and 2. Similarly, the feature 303 corresponds to the electrode attachment points 107a, 107b and the beams 301a, 301b to the flexible elements linking the lands to the attachment points. The support 302 is attached to a substrate below. The beams 301a, 301b and the feature 303 are suspended above the substrate and are free to move.

Figure 4:
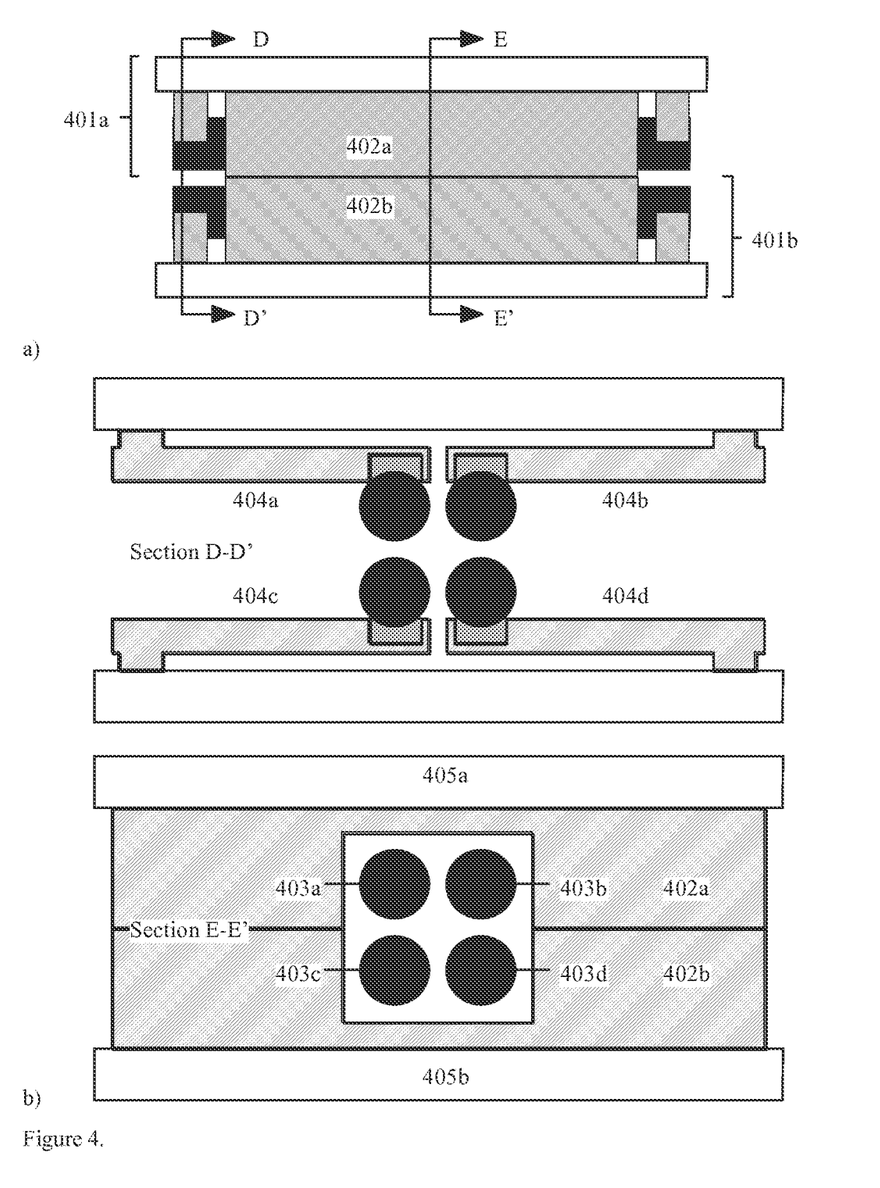
FIG. 4 shows a) in a side view and b) in sections the assembly of two substrates carrying electrode rods into a complete quadrupole, according to the present invention.

If an in-plane transverse end load is applied to the structure shown in FIG. 3a, the free end will deflect transversely. However, the rigid element 303 linking the two beams 301a, 301b ensures that these elements cannot rotate at their free ends. The deflection may be analysed by considering the deflection of a single beam 304 attached to a land 305 under an end load P as shown in FIG. 4b. Here the constraints of the portal arrangement are modeled by applying an end moment $M_e$, to the beam, whose value is chosen to prevent end rotation.

The radius of curvature R and the deflection y(x) of a loaded beam can be determined as a function of the position x along the beam from the Euler equation (see e.g. [Young 1989]):

$$1/R \approx d^2y/dx^2 = M/E_s I_s \quad (1)$$

Here M is the local bending moment, $E_s$ is the Young's modulus of the beam material and $I_s$ is its second moment of area. For a beam of breadth $b_s$ and depth $d_s$, the second moment of area is [Young 1989]:

$$I_s = b_s d_s^3/12 \quad (2)$$

Including the effects of an end load P and an end moment $M_e$, the local bending moment is:

$$M = -P(L-x) + M_e \quad (3)$$

Integrating Equation 1 twice, subject to the boundary conditions y=dy/dx=0 at x=0 and dy/dx=0 at x $L_s$, the end-moment $M_e$ and the deflection y(x) may be found as $$M_e = PL_s/2$$

$$y(x) = -P(L_s x^2/4 - x^3/6)/E_s I_s \quad (4)$$

Consequently the end deflection is:

$$y(L_s) = -PL_s^3/12 E_s I_s \quad (5)$$

Here the negative sign arises from the choice of co-ordinate system used. The stiffness $k_s$ of the beam is the deflection per unit load, or $k = -y(L_s) = 12 E_s I_s / L_s^3$.

In the portal frame suspension, there are two such elements in parallel, so the stiffness $k_P$ of the portal frame is $k_P = 24 E_s I_s / L_s^3$. Using Equation 2, the overall stiffness may be written as:

$$k_P = 2 E_s b_s d_s^3 / L_s^3 \quad (6)$$

Thus, it will be apparent that the stiffness of the portal frame is determined from the elastic property $E_s$ of the suspension material and the design dimensions $b_s$, $d_s$ and $L_s$ of the beams. Appropriate choice of these parameters may therefore provide a suitable stiffness.

Generally, the stiffness will be chosen to allow thermal expansion to take place without over-straining the elastic suspension or buckling the cylindrical electrodes.

For example, assuming that the length and thermal expansion coefficient of the cylindrical electrodes are $L_e$ and $\alpha_e$ respectively, and that the thermal expansion coefficient of the substrate assembly is $\alpha_s$, the differential thermal expansion between the electrodes and the substrate arising from a temperature rise $\Delta T$ is:

$$\Delta = (\alpha_e - \alpha_s) L_e \Delta T \quad (7)$$

For example, assuming that $\alpha_e \approx 15 \times 10^{-6} K^{-1}$, $\alpha_s = 2.5 \times 10^{-6} K^{-1}$, $L_e = 25$ mm and $\Delta T = 100$ K, we obtain $\Delta = 31.25$ μm.

Assuming that this expansion is entirely accommodated by a deflection of the elastic suspension, the load P on each beam element may be found from Equations 5 and 2 as:

$$P = E_s b_s d_s^3 \Delta / L_s^3 \quad (8)$$

Now the maximum strain in a beam of depth d, bent through a radius R is $\epsilon=d_s/2R$ [Young 1989]. The maximum value of 1/R can be found from Equation 1 and 4 as $PL_s/2E_sI_s$. Combining this result with Equations 2 and 8, the maximum strain $\epsilon_{max}$ is:

$$\epsilon_{max}=3d_s\Delta/L_s^2 \quad (9)$$

Equation 9 implies that the maximum strain may be reduced to a given safe value (for example, 0.1%) for a given displacement Δ by appropriate choice of $d_s$ and $L_s$. Generally, there are restrictions on the minimum value of $d_s$ that may be reliably formed by a microfabrication process. Given this value, the suspension length may be estimated as $$L_s=(3d_s\Delta/\epsilon_{max})^{1/2} \quad (10)$$

Assuming that d≈50 μm is appropriate for a silicon substrate of thickness 500 μm, Equation 10 implies that $L_s$≈2 mm is a suitable suspension length if $\epsilon_{max}$=0.001.

With these parameters, and assuming that $E_s$=150×10$^9$ N/m$^2$ for silicon, the stiffness of the portal frame suspension may be found from Equation 6 as $k_p$≈2350 N/m. For a displacement Δ=31.25 μm, the resulting force on each suspension beam is P≈0.035 N. The portal frame arrangement will support a load of twice this value, namely $P_P$≈0.07 N in response to a deflection Δ caused by differential thermal expansion, and hence will apply a load $P_P$ to each cylindrical electrode. The effect of this load may be considered as follows.

Using the Euler equation in conjunction with an axial load, it can be shown that the critical load $P_C$ at which a beam that is clamped at both ends to prevent rotation will buckle is (see e.g. [Young 1989]):

$$P_C=4\pi^2 E_e I_e/L_e^2 \quad (11)$$

Here $E_e$, $I_e$ and $L_e$ are the Young's modulus, second moment of area and length of the beam, respectively. For a cylindrical beam corresponding to a cylindrical electrode the second moment of area is $I_e=\pi r_e^4/4$. Assuming the typical values of $r_e$=250 μm, $L_e$=25 mm and that $E_e$≈200×10$^9$ N/m$^2$ for stainless steel, we obtain $P_C$≈40 N. Since this value of $P_C$ is much greater than the value of $P_P$ found above, it is clear that the cylindrical electrode will not buckle under to the force of the suspension. It will therefore be evident that a satisfactory strain relieving suspension based on a portal frame may easily be designed.

It will be evident that other elastic arrangements will provide a similar result. For example, the portal frame may be constructed with more than two parallel beams. Similarly, the elastic suspension may be formed from components in the substrate layer, if this is a suitably elastic material. More complex arrangements may also be used to obtain a more exact approximation to linear motion. For example, as the portal frame deflects, the initial linear shape of the two beams should desirably transform into the curved shape defined by Equation 4. To accommodate this shape, the free ends of the beams should correspondingly deflect axially. This deflection is second-order, and may be unimportant. However, its effects may be compensated by a folded flexure design such as that described in the aforementioned Tang paper [Tang 1989].

Following the teaching of GB0701809.6, the content of which is incorporated herein by way of reference, a complete quadrupole may be constructed from combining two of the assemblies in FIG. 1 as shown in FIGS. 4a and 4b. It will be understood that this example of an application of the mounting arrangement provided by the teaching of the present invention is provided as an illustration of the benefit that may be accrued from using a electrode mounting arrangement as herein described. It is not intended to limit the application of the teaching of the present invention to such an exemplary embodiment. As shown in FIGS. 4a and 4b, when fabricating such a quadrupole, two assemblies 401a and 401b carrying mounted cylindrical electrodes may be placed together so that the partial shields 402a and 402b align and abut. The two assemblies are then fixed in position. The two partial shields 402a, 402b now combine to form a complete shield surrounding but not contacting the cylindrical electrodes 403a, 403b, 403c, 403d, which are mounted on fixtures such as 404a, 404b, 404c, 404d. The two partial shields 402a, 402b also provide appropriate spacing between the two substrates 405a, 405b so that the four cylindrical electrodes are arranged as a quadrupole. It will be understood that each of the partial shields may be considered mating members having opposing mating surfaces which abut and when the two substrates are brought together to form the sandwich structure of the quadrupole.

Figure 5:
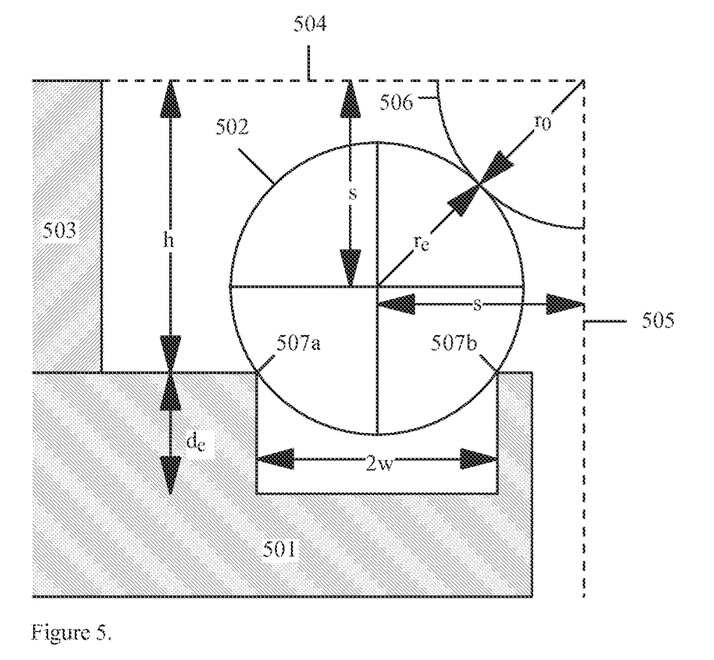
FIG. 5 shows the main geometric parameters associated with the mounting of a single cylindrical electrode in the geometry of an electrostatic quadrupole, according to the present invention.

Following the teaching of GB0701809.6, FIG. 5 shows in section how the main geometric parameters of the microfabricated quadrupole mount are established. Here, a fixed feature 501 supporting a single cylindrical electrode 502 of radius $r_e$ is shown, together with a spacer layer 503.

Conventionally it is desired to hold a cylindrical electrode of radius $r_e$ at an equal distance s from the two axes of symmetry 504, 505 of the electrostatic field created by the quadrupole assembly. The geometry is determined by the radius $r_0$ of a circle 506 that can be drawn between the four electrodes. Research has shown that a good approximation to a hyperbolic potential is obtained from cylindrical electrodes when $r_e$=1.148 $r_0$ [Denison 1971]. The distance s from the axes of symmetry to the electrode centreline is then s={$r_e$+$r_0$}/2$^{1/2}$. If the distance between the contact points 507a, 507b of the cylindrical electrode 502 and the groove in the support 501 is 2 w, the height h and hence the thickness of the spacer 503 between the contact points and the axis of symmetry 504 is h=s+$(r_e^2-w^2)^{1/2}$. Suitable choices of $r_e$, $r_0$, s, w and h therefore allow the correct geometry to be established.

Substrates of the type described may be constructed with micron-scale precision by microfabrication, using methods such as photolithography, plasma etching, metal coating and dicing. However, as will be apparent to those skilled in the art, there are many combinations of processes and materials yielding similar results. We therefore give one example, which is intended to be representative rather than exclusive. In this example, etched features are formed on silicon wafers, which are then stacked together to form batches of complete substrates. The substrates are then separated by dicing.

Figure 6:
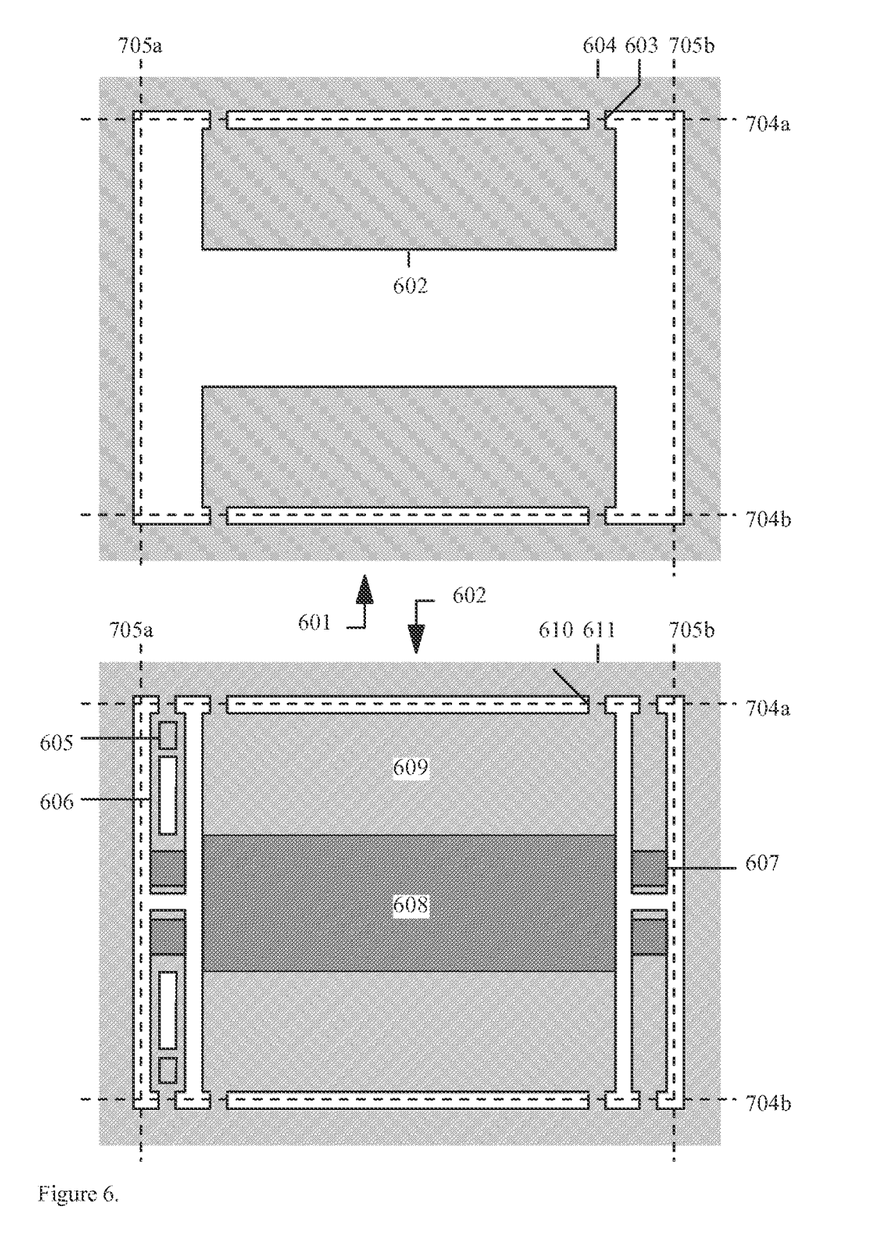
FIG. 6 shows in plan the layout of two substrates forming the mechanical parts of a mount for a miniature electrostatic quadrupole, according to the present invention.

FIG. 6 shows how two sets of parts are formed on two separate silicon wafers. The first wafer 601 carries parts defining all features of a spacer layer lying above contact points of the type shown, as 507a, 507b in FIG. 5. Because these features desirably have the height h shown in FIG. 5, the starting material is a silicon wafer, which is polished on both sides to this thickness. The wafer is patterned using photolithography to define the desired features (for example, the shield spacer 602) together with small sections (for example 603) attaching them to the surrounding wafer 604. The pattern is transferred right through the wafer using deep reactive ion etching, a plasma-based process that may etch arbitrary features in silicon at a high rate and with high verticality [Hynes 1999]. The wafer is then cleaned and metallised, for example by RF sputtering of gold.

The second wafer carries parts defining all features of the microfabricated substrate lying below the two contact points 507a, 507b in FIG. 5. Because the depth of these features is not critical in determining the accuracy of the quadrupole assembly, the thickness of this wafer is chosen mainly to allow sufficient mechanical strength. The wafer is patterned three times. In the first step, the wafer is patterned to define partially etched features on the rear side of the wafer such as the land 605 that supports the flexible electrode mount 606. In the second step, the wafer is patterned to define partially etched features of the front side of the wafer such as the seating features for the cylindrical electrodes (for example, 607) and the trench 608 in the conducting shield 609. In the third step the wafer is patterned to define fully etched features outlining all the main parts. Once again, features are attached to the surrounding substrate 611 by short sections (for example, 610).

The patterns are again transferred into the wafer using deep reactive ion etching, so that the partially etched features on the front side of the wafer are etched to the sufficient depth $d_e$ in FIG. 5 and the fully etched features are transferred right through. Multilevel etching of this type may easily be performed using a multilevel surface mask, well known to those skilled in the art [Mita 2000]. The lithographic masks are removed, and the wafer is cleaned and metallized. Suitable coating metals again include gold.

Figure 7:
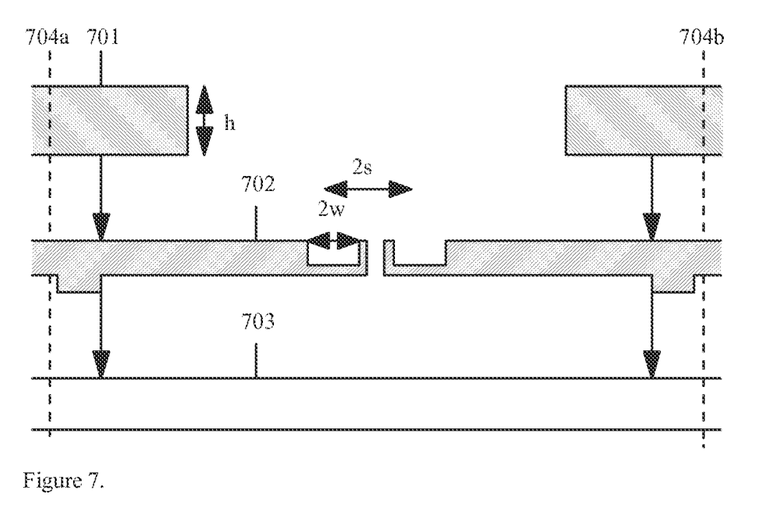
FIG. 7 shows in section the assembly of a set of substrates forming the mount for a miniature electrostatic quadrupole, according to the present invention.

FIG. 7 shows how the wafers are assembled into a stack forming a set of complete microfabricated assemblies. The upper wafer 701 is attached to the lower wafer 702, which is in turn attached to an insulating substrate 703, for example a glass wafer. An alternative substrate material is a ceramic. Suitable attachment methods include silicon-silicon direct bonding, silicon-glass anodic bonding and gold-to-gold compression bonding. Depending on which process is used, metallisation may take place before or after assembly. Rectangular dies comprising individual microfabricated substrates are then separated using a dicing saw, for example by sawing along a first set of parallel lines 704a, 704b, which separate all sections of sprue, and a second set of orthogonal parallel lines 705a, 705b.

Quadrupoles are then completed, by inserting cylindrical electrodes into microfabricated substrates as previously shown in FIGS. 1 and 2 and then assembling two such substrates as previously shown in FIG. 4. Wirebond connections to external circuitry are then attached to the cylindrical electrode supports and to the shield.

It will be appreciated that the processes described above can be used to construct a microfabricated quadrupole containing the main features described, namely electrically-isolated supports for cylindrical electrodes in both fixed and suspended arrangements, and a conducting shield, the overall assembly having the correct geometrical relationship.

However, it will also be appreciated that many alternative fabrication processes can achieve a similar result. For example, the lower silicon wafer may be replaced with a silicon-on-glass wafer, thus eliminating the need for the lower wafer-bonding step shown in FIG. 7. Alternatively, the two silicon wafers may be combined together into a single layer, which is multiple structured by etching to combine all the necessary features, thus eliminating the need for the upper wafer-bonding step shown in FIG. 7. In this case, the precision needed to define the height h may be achieved using a buried etch stop, which may be provided using a bonded-silicon-on-insulator wafer.

It will be understood that exemplary applications of a flexible mounting arrangement have been described with reference to specific embodiments in the field of quadrupole mass spectrometers. While such a mounting arrangement is particularly useful in provision of a mounting for a miniature quadrupole mass filter, linear quadrupole ion trap or quadrupole ion guide, in which good electrical performance is combined with mechanical insensitivity to temperature variations, it is not intended that the present invention be so limited in that any mounting arrangement for an electrode onto a support member that benefits from provision of a compensation for thermal coefficient differences between both the electrode and the support member could benefit from a system or arrangement provided in accordance with the teaching of the invention. Furthermore, whereas the quadrupole example has been described with reference to a single set of four electrodes mounted relative to one another in a quadrupole arrangement, it will be understood that the mounting arrangement provided in accordance with the teaching of the invention could be equally used in the provision of a tandem mass spectrometer, i.e. that type of mass spectrometer where two quadrupoles are arranged co-axially.

Within the context of the present invention the term microengineered or microengineering or microfabricated or microfabrication is intended to define the fabrication of three dimensional structures and devices with dimensions in the order of microns. It combines the technologies of microelectronics and micromachining. Microelectronics allows the fabrication of integrated circuits from silicon wafers whereas micromachining is the production of three-dimensional structures, primarily from silicon wafers. This may be achieved by removal of material from the wafer or addition of material on or in the wafer. The attractions of microengineering may be summarised as batch fabrication of devices leading to reduced production costs, miniaturisation resulting in materials savings, miniaturisation resulting in faster response times and reduced device invasiveness. Wide varieties of techniques exist for the microengineering of wafers, and will be well known to the person skilled in the art. The techniques may be divided into those related to the removal of material and those pertaining to the deposition or addition of material to the wafer. Examples of the former include:

Wet chemical etching (anisotropic and isotropic)
    Electrochemical or photo assisted electrochemical etching
    Dry plasma or reactive ion etching
    Ion beam milling
    Laser machining
    Excimer laser machining Whereas examples of the latter include:

Evaporation
    Thick film deposition
    Sputtering
    Electroplating
    Electroforming
    Moulding
    Chemical vapour deposition (CVD)
    Epitaxy These techniques can be combined with wafer bonding to produce complex three-dimensional, examples of which are the interface devices provided by the present invention.

Where the words "upper", "lower", "top", bottom, "interior", "exterior" and the like have been used, it will be understood that these are used to convey the mutual arrangement of the layers relative to one another and are not to be interpreted as limiting the invention to such a configuration where for example a surface designated a top surface is not above a surface designated a lower surface.

Furthermore, the words comprises/comprising when used in this specification are to specify the presence of stated features, integers, steps or components but does not preclude the presence or addition of one or more other features, integers, steps, components or groups thereof.

References

Paul W., Raether M. "Das electrische massenfilter" Z. Physik 140, 262-273 (1955).

Dawson P. H. "Quadrupole mass spectrometry and its applications" Elsevier Scientific Pub. Co., Amsterdam (1976).

Denison D. R. "Operating parameters of a quadrupole in a grounded cylindrical housing" J. Vac. Sci. & Tech. 8 266-269 (1971).

Dawson P. H. "Performance characteristics of an RF-only quadrupole" Int. J. Mass Spect. Ion Proc. 67, 267-276 (1985).

Miller P. E., Bonner Denton M. "The transmission properties of an RF-only quadrupole mass filter" Int. J. Mass Spect. 72, 223-238 (1986).

Douglas D. J. "Applications of collision dynamics in quadrupole mass spectrometry" J. Am. Soc. Mass Spect. 9, 101-113 (1998).

Prestage J. D., Dick G. J., Maleki L. J. "New ion trap for frequency standard applications" Appl. Phys. 66, 1013-1017 (1989).

Hager J. W. "A new linear ion trap mass spectrometer" Rapid Comm. in Mass Spect. 16, 512-526 (2002).

Hager J. W. "Axial ejection in a multipole mass spectrometer" U.S. Pat. No. 6,177,668 (2001) MDS.

Campbell J. M., Collings B. A., Douglas D. J. "A new linear ion trap time-of-flight system with tandem mass spectrometry capabilities" Rapid Comm. in Mass Spect. 12, 1463-1474 (1998).

Dawson P. H., Meuneier M. "Some distortions in quadrupole fields and their relation to mass filter performance" Int. J. Mass Spect. Ion Phys. 29, 269-299 (1979).

Dawson P. H. "Quadrupole mass filter with bent or bowed rod sets" Int. J. Mass Spect. Ion Proc. 84, 185-201 (1988).

Taylor S., Tate T. J., Syms R. R. A., Dorey H. A. "Quadrupole mass spectrometers" U.S. Pat. No. 6,025,591 Feb. 15 (2000).

Syms R. R. A, Tate Ti., Ahmad M. M., Taylor S. "Fabrication of a microengineered quadrupole electrostatic lens" Elect. Lett. 32, 2094-2095 (1996).

Syms R. R. A., Tate T. J., Ahmad M. M., Taylor S. "Design of a microengineered quadrupole electrostatic lens" IEEE Trans. on Electron Devices TED-45, 2304-2311 (1998).

Taylor S., Tunstall J. J., Leck J. H., Tindall R., Julian P., Batey J., Syms R. R. A., Tate T. J., Ahmad M. M. "Performance improvements for a miniature quadrupole with a micromachined mass filter" Vacuum 53, 203-206 (1999).

Syms R. R. A. "Monolithic microengineered mass spectrometer" GB 2391694 Mar. 1 (2006).

Geear M., Syms R. R. A., Wright S., Holmes A. S. "Monolithic MEMS quadrupole mass spectrometers by deep silicon etching" IEEE/ASME J. Microelectromech. Syst. 14, 1156-1166 (2005).

Syms R. R. A. "High performance microfabricated electrostatic quadrupole lens" GB0701809.6 Jan. 31 (2007).

Young W. C. "Roark's formulas for stress and strain", 6$^{th}$ Edn., McGraw Hill International, New York (1989).

Tang W. C., Nguyen T.-C. H., Howe R. T. "Laterally driven polysilicon resonant microstructures" Sensors and Actuators 20, 25-32 (1989).

Hynes A. M., Ashraf H., Bhardwaj J. K., Hopkins J., Johnston I., Shepherd J. N. "Recent advances in silicon etching for MEMS using the ASEM process" Sensors and Actuators 74, 13-17 (1999).

Mita Y., Tixier A., Oshima S., Mita M., Gouy J.-P., Fujita H. "A silicon shadow mask with unlimited patterns and a mechanical alignment structure by Al-delay masking process" Trans. JIEE 120-E, 357-362 (2000).

What is claimed is:

1. A microfabricated mounting arrangement supporting at least one cylindrical electrode having a lengthwise axis, the arrangement comprising a substrate having a first and a second support member configured to support and connect electrically to the at least one electrode at a first and a second end thereof, the electrode being attached to the support member, and wherein at least a portion of one of the first and second support member is adapted to flex so as to allow movement of the attached electrode parallel to its lengthwise axis to compensate for thermal coefficient differences between the electrode and the substrate.

2. The arrangement of claim 1 wherein the movement of the at least partially moveable member is effected by suspending at least a portion of the moveable member relative to the substrate.

3. The arrangement of claim 1 wherein one of the first and second support members is at least partially moveable relative to the substrate and the other of the first and second support members is not moveable.

4. The arrangement of claim 1 wherein each of the first and second support members include an electrically conducting surface which, in use, is in electrical contact with the supported at least one electrode.

5. The arrangement of claim 1 wherein the substrate is an electrically insulating substrate.

6. The arrangement of claim 1 wherein each of the first and second support members are physically isolated from one another.

7. The arrangement of claim 1 wherein each of the first and second support members are electrically isolated from one another.

8. The arrangement of claim 1 wherein the substrate is an insulating substrate.

9. The arrangement of claim 8 wherein the insulator for the insulating substrate is formed from a glass or ceramic material.

10. The arrangement of claim 1 wherein each of the support members are formed from metal-coated silicon.

11. The arrangement of claim 1 wherein the at least partially moveable support member provides for relief in axial strain in the inserted cylindrical electrodes.

12. The arrangement of claim 1 wherein each of the support members are fabricated using at least one of the following processes:
   a) a lithographic process,
   b) an etching process,
   c) a deep reactive ion etching of silicon.

13. A microfabricated mount for a miniature electrostatic quadrupole, the mount including first, second, third and fourth mounting arrangements each as claimed in claim 1 and each configured to support a separately inserted electrode, and wherein the mounting arrangements are provided in two pairs, each pair sharing a common substrate, the quadrupole being formed by sandwiching the two substrates.

14. The mount of claim 13 wherein each of the two pairs of mounting arrangements are positioned relative to one another on their shared substrates such that when supported two similar inserted cylindrical electrodes mounted side by side on each of the two pairs have parallel axes.

15. The mount of claim 13 wherein the at least partially moveable support members are arranged in the geometry of a portal frame.

16. The mount of claim 13 including corresponding mating members provided on each of the two substrates, the mating members having mating surfaces which are brought into contact with one another on forming the sandwich structure, the height of the mating members defining the distance of each of the two substrates from one another.

17. The mount of claim 16 wherein the mating members are dimensioned such that when the sandwich structure is formed that inserted electrodes are encapsulated or shielded within the mating members.

18. The mount of claim 13, in which the two-substrate assembly is configured to hold four cylindrical electrodes in the geometry of one of:
   a) a quadrupole electrostatic lens,
   b) a mass filter,
   c) a linear quadrupole ion trap,
   d) a quadrupole ion guide.

19. A microfabricated mount for a miniature electrostatic quadrupole comprising:
   a first and second insulating substrate, each substrate carrying at least four physically separated support members with electrically conducting surfaces arranged in two pairs, at least one element of each pair being partially suspended and flexible relative to the substrate; and wherein each pair of support members are configured to support and connect electrically to either end of a separate inserted cylindrical electrode having a lengthwise axis and which is attached to at least one end to the respective element, a flexing of the at least one element allowing a movement of the electrode attached thereto parallel to its lengthwise axis and relative to the substrate to compensate for thermal coefficient differences between the electrode and the substrate.

20. A microfabricated mount for a miniature electrostatic quadrupole as in claim 19, in which the partially suspended flexible elements are arranged in the geometry of a portal frame.

21. A microfabricated mount for a miniature electrostatic quadrupole as in claim 20, in which the portal frame consists of at least two suspended parallel beams, rigidly attached to the substrate at one end and linked together at the other by a rigid suspended element.

22. A microfabricated mount for a miniature electrostatic quadrupole as in claim 21, in which the rigid suspended element of the portal frame is used to support one end of a suspended cylindrical electrode.

23. A microfabricated mount for a miniature electrostatic quadrupole as in claim 19 configured to hold and support two similar inserted cylindrical electrodes with their axis parallel to and located in a trench formed in a further feature provided on the substrate.

24. A microfabricated mount for a miniature electrostatic quadrupole as in claims 23, in which the two substrates are assembled together and held parallel at a defined separation by contacting together the surfaces of the features containing the trenches.

25. A microfabricated mount for a miniature electrostatic quadrupole as in claim 23, in which the two features containing trenches combine to form a continuous conducting shield around the cylindrical electrodes.

26. A microfabricated mount for a miniature electrostatic quadrupole as in claim 19, in which the cylindrical electrodes are formed in a metal.

27. A microfabricated mount for a miniature electrostatic quadrupole as claim 26 in which the metal used for the cylindrical electrodes is stainless steel.

* * * * *